(12) United States Patent
Lee et al.

(10) Patent No.: US 6,872,502 B2
(45) Date of Patent: Mar. 29, 2005

(54) CHEMICALLY AMPLIFIED NEGATIVE PHOTORESIST, AND PHOTORESIST COMPOSITION

(75) Inventors: Beom-Wook Lee, Uiwang (KR); Ik-Chul Lim, Suwon (KR); Seung-Joon Yoo, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 79 days.

(21) Appl. No.: 10/092,846

(22) Filed: Mar. 7, 2002

(65) Prior Publication Data
US 2003/0054285 A1 Mar. 20, 2003

(30) Foreign Application Priority Data
Apr. 3, 2001 (KR) ......................................... 2001-17601

(51) Int. Cl.⁷ ................................................. G03C 1/76
(52) U.S. Cl. .................... 430/270.1; 526/266; 526/270; 549/369; 549/357
(58) Field of Search ....................... 430/270.1; 526/270, 526/266, 280; 549/369, 357

(56) References Cited

U.S. PATENT DOCUMENTS

| | | | |
|---|---|---|---|
| 3,256,254 A | * | 6/1966 | Reinhardt et al. .......... 526/217 |
| 3,666,473 A | | 5/1972 | Colom et al. |
| 4,076,727 A | * | 2/1978 | Zey et al. .................... 549/372 |
| 4,115,128 A | | 9/1978 | Kita |
| 4,173,470 A | | 11/1979 | Fahrenholtz et al. |
| 4,311,782 A | | 1/1982 | Buhr et al. |
| 4,405,708 A | | 9/1983 | van Pelt et al. |
| 4,491,628 A | | 1/1985 | Ito et al. |
| 4,975,519 A | * | 12/1990 | Yang et al. .................. 528/230 |
| 5,286,808 A | * | 2/1994 | Collins et al. ............... 525/401 |
| 5,585,223 A | | 12/1996 | Fréchet et al. |
| 5,691,111 A | | 11/1997 | Iwasa et al. |
| 5,756,850 A | | 5/1998 | Iwasa et al. |
| 5,955,241 A | | 9/1999 | Sato et al. |
| 6,028,153 A | | 2/2000 | Jung |
| 6,042,991 A | * | 3/2000 | Aoai et al. ................. 430/285.1 |
| 6,074,801 A | | 6/2000 | Iwasa et al. |
| 6,106,998 A | | 8/2000 | Maeda et al. |
| 6,258,508 B1 | * | 7/2001 | Kim et al. ................ 430/270.1 |
| 6,482,565 B1 | * | 11/2002 | Jung et al. ................ 430/270.1 |
| 2002/0143130 A1 | * | 10/2002 | Lee et al. .................... 526/266 |

* cited by examiner

Primary Examiner—Yvette C. Thornton
(74) Attorney, Agent, or Firm—Christie, Parker and Hale, LLP

(57) ABSTRACT

A polymer for a chemically amplified negative photoresist and a photoresist composition are provided. A representative polymer of the invention is a compound of formula 5:

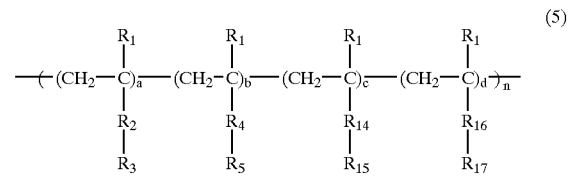

(5)

wherein: $R_1$ through $R_5$ and $R_{14}$ through $R_{17}$ are defined as set fourth in the specification, and a, b, c, and d represent the mole ratios of each monomer, wherein a has a value of 0–0.5, b has a value of 0–0.9, c has a value of 0–0.3, and d has a value of 0–0.3, provided that $a+b+c+d=1$; and n represents the degree of polymerization of each polymer, and has a value of at least 2.

5 Claims, No Drawings

CHEMICALLY AMPLIFIED NEGATIVE PHOTORESIST, AND PHOTORESIST COMPOSITION

CROSS REFERENCE TO RELATED APPLICATION

This application claims priority of application No. 2001-17601 filed in the Korean Industrial Property Office on Apr. 3, 2001, the disclosure of which is incorporated herein by reference.

FIELD OF THE INVENTION

The present invention relates to a polymer for a chemically amplified negative photoresist, and a photoresist composition. More particularly, this invention relates to a chemically amplified negative photoresist composition which enables the formation of high resolution patterns.

BACKGROUND OF THE INVENTION

Photoresist compositions are used for the formation of circuit patterns such as circuits of liquid crystal display devices or semiconductor integrated circuits. Conventionally, novolak-based resins which are alkai-soluble phenol-(or cresol-) formaldehyde resins, and naphthoquinonediazido-based compounds as photosensitive materials are widely used in photoresist compositions, as disclosed in U.S. Pat. Nos. 3,666,473, 4,115,128, and 4,173,470.

Recently, along with increasing requirements of fine micro-circuit patterns, the wavelengths of KrF (248 nm) and ArF excimer laser (193 nm) are used for the formation of circuit patterns. At these wavelengths the novolak-based resins and naphthoquinonediazo-based compounds lose their applicability due to their poor sensitivity and strong absorption at 248 and 193 nm. Consequently, there is a demand for the development of a novel photoresist resin that can be used effectively at the above wavelengths.

It is essential for a novel photoresist resin to satisfy various requirements such as high sensitivity, high resolution, and high resistance against dry etching. Among those requirements, sensitivity is the most important property. As a solution to enhance sensitivity, the concept of chemical amplification has been introduced in this field of technology.

In the chemical amplification process, an active species generated by a photochemical reaction acts as a catalyst which promotes a continuous reaction of deprotection, crosslinking, and the like. As a result, the total quantum yield is amplified to a much higher level with a small amount of the active species. In this manner, a highly-sensitive photoresist is provided. Recently, chemically amplified photoresists have been increasingly highlighted in photolithographic processes for semiconductor production in order to achieve high photosensitivity. Chemically amplified photoresist compositions contain photoresist resins having acid-sensitive reactivity, photoacid generators, and organic solvents as a mixing medium for other components.

The reaction mechanism of chemically amplified photoresists is such that photoacid generators generate strong protonic acids when they are exposed to light and these acids cause an acid-catalysis reaction of the photoresist resins to proceed. At this stage, a deprotection reaction is preformed for a positive photoresist composition, whereas a crosslinking reaction is performed in the case of a negative photoresist. As a result of such a reaction, the exposed portion shows a different solubility in a developing agent than the unexposed portion, and can be utilized in patterning process. As an example of these chemically amplified photoresists, a compound of polyvinylphenol resin protected by a t-butoxycarbonyl group-photoacid generator is disclosed in U.S. Pat. Nos. 4,311,782, 4,405,708, and 4,491,628. The ArF excimer laser lithography is expected to be the most promising lithography method for manufacturing of 1 Gbit or more DRAMs of semiconductor chips. However, since aromatic compounds in the polyvinylphenol give low photosensitivity due to strong absorption at a wavelength of 193 nm, it is only applicable at a wavelength of 248 nm or higher.

Under these circumstances, in order to develop a photoresist resin having high transmittance at a wavelength of 193 nm, and with high resolution as well as high resistance against dry etching, an aliphatic cyclic compound-included chemically amplified photoresist has been considered. For example, there has been reported in U.S. Pat. Nos. 5,585,223, 5,691,111, and 5,756,850 a compound with an alicyclic compound bonded on a (meth)acrylic side chain or a (meth)acrylic polymer having an alicyclic compound as a dissolution inhibitor. Another type of compound with an alicyclic compound composed of a polymeric main chain by means of copolymerization of norbornene monomers and maleic anhydride has also been reported in U.S. Pat. No. 6,028,153.

For a chemically amplified negative photoresist using a photoacid generator, U.S. Pat. Nos. 6,106,998, 6,074,801, and 5,955,241 disclose a process using an epoxy group or an alkoxymethylamide group as a crosslinking functional group. However, there is still an unsatisfactory level of resolution due to the occurrence of swelling during the developing process.

SUMMARY OF THE INVENTION

An object of the present invention is to provide a monomer for a chemically amplified negative photoresist useful for the preparing a chemically amplified negative photoresist polymer that does not cause problems such as swelling.

Another object of the present invention is to provide a polymer for a chemically amplified negative photoresist prepared with the monomer.

Still another object of the present invention is to provide a chemically amplified negative photoresist composition including the polymer, which enables forming a pattern of high resolution.

In order to achieve these objects, the present invention provides a monomer for a chemically amplified negative photoresist represented by Formula 1 or 2:

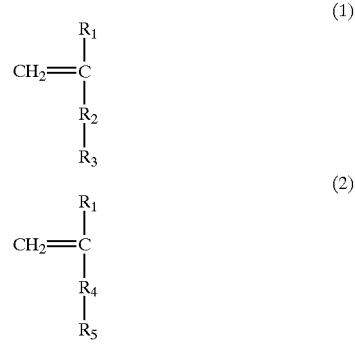

wherein, $R_1$ is H or $CH_3$;

$R_2$ and $R_4$ are each independently selected from $(R)_\alpha(CH_2)_\beta R'$ and $(R)_\alpha[(CH_2)_\gamma O]_\delta R'$ (wherein, R is CO, $CO_2$, O, OCO, or $OCO_2$, R' is O, $CO_2$, or $OCO_2$, $\alpha$ is 0 or 1, $\beta$ is 0 to 5, $\gamma$ is 1 or 2, and $\delta$ is 1 to 5);

$R_3$ is selected from:

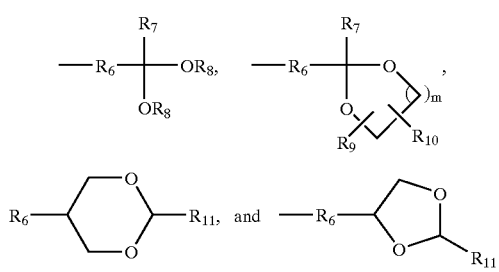

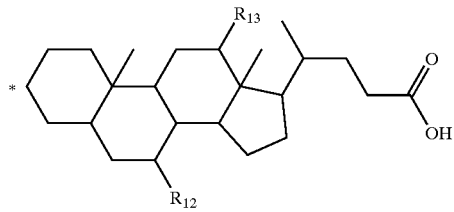

wherein $R_6$, which combines an acetal compound and a vinyl compound, is a $C_1$–$C_5$ saturated alkyl, a $C_1$–$C_5$ ether, or a $C_1$–$C_5$ carbonyl; $R_7$ to $R_{11}$ are each independently selected from H, $C_1$–$C_5$ saturated alkyls, $C_1$–$C_5$ ethers, $C_1$–$C_5$ carbonyl groups, and $C_1$–$C_5$ alcohol groups; and m is a number ranging from 1–5, and $R_5$ is represented by the formula:

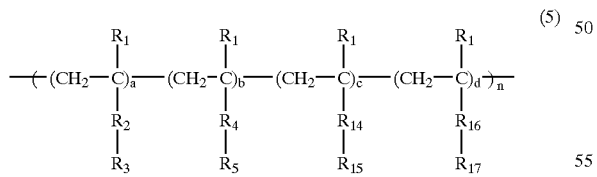

wherein, $R_{12}$ and $R_{13}$ are each independently selected from H and OH;

and * represents a bonding site at which the $R_4$ group is bonded.

The present invention further provides a polymer for a chemically amplified negative photoresist represented by formula 5:

$$-\!\!\left(\!(CH_2-\underset{\underset{R_3}{\overset{R_1}{\overset{|}{C}}}{\overset{|}{}}}{C})_a-(CH_2-\underset{\underset{R_5}{\overset{R_1}{\overset{|}{C}}}{\overset{|}{}}}{C})_b-(CH_2-\underset{\underset{R_{15}}{\overset{R_1}{\overset{|}{C}}}{\overset{|}{}}}{C})_c-(CH_2-\underset{\underset{R_{17}}{\overset{R_1}{\overset{|}{C}}}{\overset{|}{}}}{C})_d\!\right)_n\!\!-$$ (5)

wherein:

$R_1$ is H or $CH_3$;

$R_2$ and $R_4$ are each independently selected from $(R)_\alpha(CH_2)_\beta R'$ and $(R)_\alpha[(CH_2)_\gamma O]_\delta R'$ (wherein, R is CO, $CO_2$, O, OCO, or $OCO_2$, R' is O, $CO_2$, or $OCO_2$, $\alpha$ is 0 or 1, $\beta$ is 0 to 5, $\gamma$ is 1 or 2, and $\delta$ is 1 to 5);

$R_3$ is selected from:

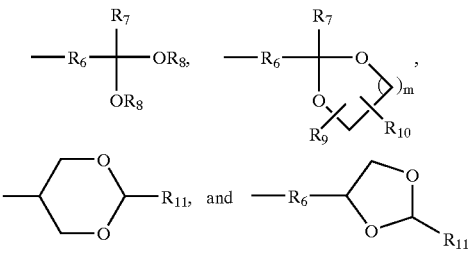

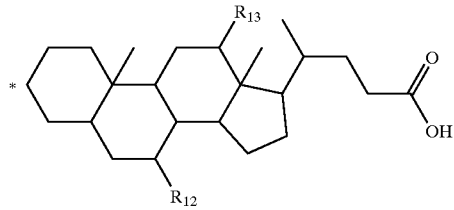

wherein $R_6$, which combines an acetal compound and a vinyl compound, is a $C_1$–$C_5$ saturated alkyl, a $C_1$–$C_5$ ether, or a $C_1$–$C_5$ carbonyl; $R_7$ to $R_{11}$ are each independently selected from H, $C_1$–$C_5$ saturated alkyls, $C_1$–$C_5$ ethers, $C_1$–$C_5$ carbonyl groups, and $C_1$–$C_5$ alcohol groups; and m is a number ranging from 1–5, $R_5$ is represented by the following formula:

wherein $R_{12}$ and $R_{13}$ are each independently selected from H and OH;

and * represents a bonding site at which the $R_4$ group is bonded;

$R_{14}$ and $R_{16}$ are each independently selected from a single bond, $(R)_\alpha(CH_2)_\beta R'$ and $(R)_\alpha[(CH_2)_\gamma O]_{67} R'$ (wherein, R is CO, $CO_2$, O, OCO, or $OCO_2$, R' is O, $CO_2$, or $OCO_2$, $\alpha$ is 0 or 1, $\beta$ is 0 to 5, $\gamma$ is 1 or 2, and $\delta$ is 1 to 5); $R_{15}$ is a hydroxyl group; $R_{17}$ is a one having carboxyl group;

a, b, c, and d represent the mole ratios of the corresponding monomers, a has a value of 0–0.5, b has a value of 0–0.9, c has a value of 0–0.3, and d has a value of 0–0.3, provided that a+b+c+d=1; and n represents the degree of polymerization of each polymer, and has a value of at least 2, and preferably 2 to 100,000.

The present invention further provides a chemically amplified negative photoresist composition including the polymer and a photoacid generator.

DETAILED DESCRIPTION OF THE INVENTION

The present invention relates to a polymer that is useful for a chemically amplified negative photoresist composition that is used in a photolithographic process with a light source of ultraviolet or deep ultraviolet radiation for the formation of micro-patterns of semiconductor devices. A representative polymer for the above polymer is a compound of formula 5:

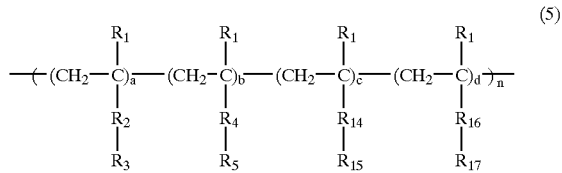

(5)

wherein $R_1$, $R_2$, $R_3$, $R_4$, $R_5$, $R_{14}$, $R_{15}$, $R_{16}$, $R_{17}$, a, b, c, d, and n are the same as defined above.

The acetal group included in the polymer of formula 5 functions as a site where a crosslinking reaction occurs when it is heated in the presence of an acid, and the bile acid derivative of formula 5 functions to provide a hydroxyl group participating in the crosslinking reaction and to increase resistance against dry etching by alicyclic rings.

The polymer represented by the formula 5 can be formed by the polymerization of monomers of the formulas 1 to 4:

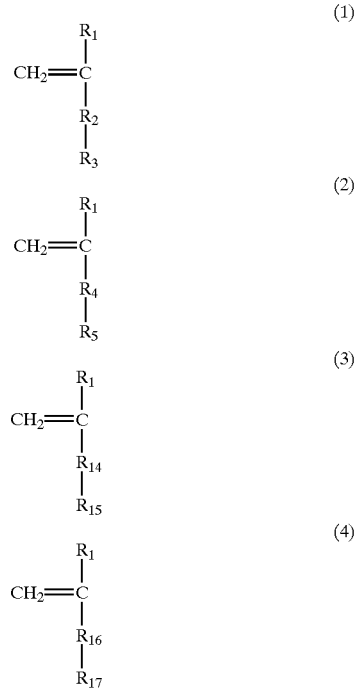

(1)

(2)

(3)

(4)

wherein, $R_1$ to $R_5$, $R_{14}$ to $R_{17}$ are the same as defined above.

The compound of formula 1 may be prepared by reacting an alcohol containing an acetal group with a vinyl compound. The alcohol containing an acetal group may be prepared by reacting aldehydes with triol compounds. An example of the preparation method is one in which aldehydes and glycerols are mixed with petroleum ether, benzene, or toluene, which forms an azeotropic mixture, and the mixture is heated in the presence of an acid, such as p-toluenesulfonic acid, and refluxed. Water generated during the reaction is removed by dean a stark apparatus. Then the resultant primary alcohol containing an acetal group is reacted with a vinyl compound, such as (meth) acryoylchloride, whereby a vinyl-based monomer of formula 1 is obtained.

Examples of the aldehydes include acetaldehyde, isobutylaldehyde, butylaldehyde, 2-methylbutylaldehyde, 2-ethylbutylaldehyde, valeraldehyde, isovaleraldehyde, 3,3-dimethylbutylaldehyde, 2-methylvaleraldehyde, and 2,3-dimethylvaleraldehyde. Since the above-mentioned reactions of acetal and vinyl compounds and of aldehydes and glycerols are well known in the art, a detailed description thereof is omitted in this specification.

Alternatively, the monomer of the formula 1 may be prepared by reacting sodium acrylate or potassium acrylate with bromoacetaldehyde, 2-(2-bromomethyl)-1,3-dioxolane, or 2-(2-bromoethyl)-1,3-dioxane.

The homopolymer or copolymer prepared by polymerizing monomers of the formula 1 or 2 may be used as the photoresist polymer. In the case of using the homopolymer, it is preferable to use a blend of two different homopolymers, and the mixing ratio of the homopolymers may be properly adjusted according to the desired properties of the product.

The homopolymer may be represented by the following formula 6 or 7:

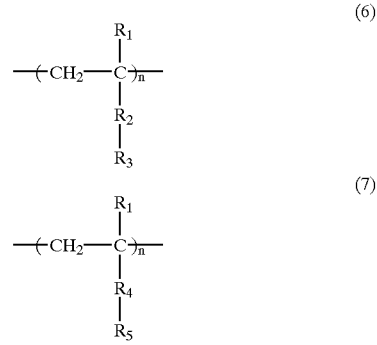

(6)

(7)

wherein $R_1$ to $R_5$ and n are the same as defined above.

The homopolymer of formula 6 can be prepared by polymerizing the monomer of formula 1, and the homopolymer of formula 7 can be prepared by polymerizing the monomer of formula 2. Any of the conventional methods to produce polymers can be utilized as the polymerization process for the present invention, and a radical polymerization process will be described below.

The monomer of formula 1 is dissolved in a solvent such as tetrahydrofuran, and an initiator for radical polymerization, such as 2,2'-azobisisobutyronitrile, is added to the solution, the reaction resulting in the polymer of formula 6.

In addition, a copolymer of formula 5 and a homopolymer of formula 6 or 7 may be used as a photoresist polymer for the present invention.

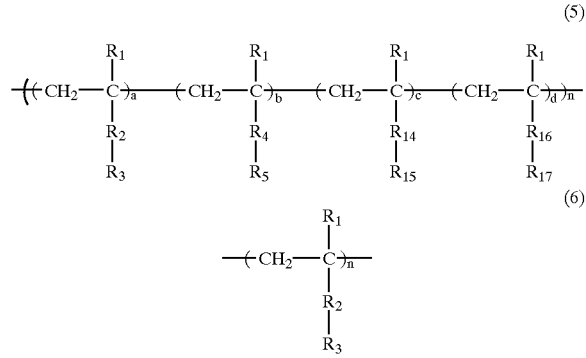

(5)

(6)

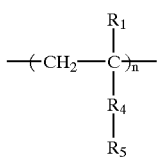

(7)

wherein $R_1$ to $R_5$, $R_{14}$ to $R_{17}$, a, b, c, d and n are the same as defined above.

In the formula 5, the monomer having a hydroxyl functional group acts as a controller of the degree of crosslinking, and the monomer having a carboxyl functional group controls photosensitivity and developing capability.

A photoresist composition according to the present invention includes as a photoresist resin a homopolymer of the formula 6 or 7, or a mixture thereof, and preferably a blend of the homopolymers. Alternatively, the photoresist composition includes a copolymer of the formula 5. In addition, the photoresist composition includes a photoacid generator. In the photoresist composition, the content of polymer as the photoresist resin ranges from 10 to 20 wt. % based on photoresist, and the content of the photoacid generator preferably ranges from 1 to 5 wt. % of the polymer. If the content of polymer is less than 10 wt. %, either the film will be too thin or formation of the film will be insufficient, whereas if the content of polymer exceeds 20 wt. %, it will be difficult to obtain a uniform film due to an increase in the viscosity of the photoresist.

As for the photoacid generator, if the content is less than 1 wt. % of the polymer, a deficiency of the amount of acid generated will lead to insufficient crosslinking, while if the content exceeds 5 wt. %, photosensitivity will be decreased due to the increased UV absorption by the photoacid generator itself.

The photoacid generator produces acid when it is exposed to UV light. The acid thus generated will activate an alcohol group of the polymer to attack an acetal group, and thereby promotes a crosslinking reaction. As the photoacid generator, any conventionally known compound capable of generating an acid by the irradiation of UV light can be used without any special limitation. Examples of such a photoacid generator include one or more sulfonium salts or onium salts, such as diphenyliodonium hexafluorophosphate, diphenyliodonium hexafluoroarsenate, diphenyliodonium hexafluoroantimonate, diphenylparaisobutylphenyl triplate, diphenylparatoluenyl triplate, diphenylpara-t-butylphenyl triplate, triphenylfulfonium hexafluorophosphate, triphenylsulfonium hexafluoroarsenate, triphenylsulfonium hexafluoroantimonate, triphenylsulfonium triplate, or dibutylnaphthylsulfonium triplate.

The photoresist composition according to the present invention includes an organic solvent. As the organic solvent, cyclohexanone, methyl 3-methoxypropionate, ethyl 3-ethoxypropionate, propylene glycol monomethylether acetate, or other general organic solvent can be used.

The photoresist composition according to the present invention is activated when it is heated in the presence of an acid, such that a nucleophilic functional group, such as a hydroxyl or carboxyl group, attacks an acetal group to result in a crosslinking reaction. Acid is generated when the photoacid generator is irradiated by light, and the crosslinking reaction in the presence of an acid proceeds in a chemically amplified manner, so that photosensitivity is enhanced and no swelling occurs due to the increased degree of crosslinking.

A method of pattern formation using the photoresist composition according to the present invention is described below.

A photoresist resin and a photoacid generator are dissolved in an organic solvent, and then the solution is selectively filtered with a filter to produce a photoresist. The obtained photoresist is coated onto a silicon wafer. The method of coating includes any conventionally known processes, a typical example being a spin-coating process. Subsequently, the wafer is pretreated (soft-baked) in an oven or a hot-plate at 90–150° C. for 60–120 seconds, and the resultant product is then subjected to irradiation using a UV or excimer laser exposure tools. The exposed wafer is subjected to post-treatment (post-bake) in an oven or a hot-plate at 90–150° C. for 60–120 seconds. The post-baked wafer is dipped into a developing solution for a predetermined period to form a photoresist pattern. The developing solution includes at least one composition selected from aqueous solutions of tetramethylammonium hydroxide, potassium hydroxide, potassium carbonate, sodium phosphate, sodium silicate, and ammonia water or an alkali solution of an aqueous amine.

The following examples illustrate the present invention in further detail, but the present invention is not limited by these examples.

EXAMPLE 1

0.5 mol of sodium acrylate and 0.4 mol of bromoacetaldehyde diethylacetal were dissolved in dimethyl sulfate, and the solution was stirred at a temperature of 35° C. for 10 hours. The reaction temperature was cooled to ambient temperature, and then the product was separated from the reaction mixture by using water and ethyl ether. After the product was concentrated by means of a vacuum evaporator, the concentrate was subjected to vacuum distillation to yield a compound of formula 8:

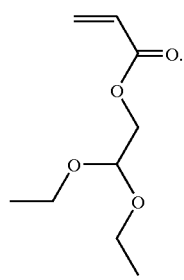

(8)

EXAMPLE 2

A compound of formula 9 was prepared by the same procedure as in Example 1 except that 2-(2-bromoethyl)-1,3-dioxolane was used instead of bromoacetaldehyde diethylacetal

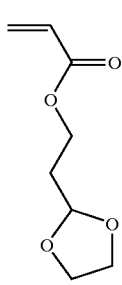

(9)

EXAMPLE 3

A compound of formula 10 was prepared by the same procedure as in Example 1 except that 2-(2-bromoethyl)-1,3-dioxane was used instead of bromoacetaldehyde diethylacetal.

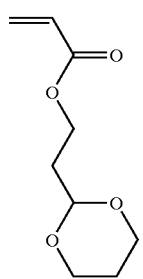

(10)

EXAMPLE 4

0.2 mol of butylaldehyde, 0.26 mol of glycerol, and a trace amount of p-toluene sulfonic acid were dissolved in petroleum ether, and the solution was heated to reflux for 6 hours in a reactor equipped with a dean stark apparatus to terminate the reaction. Then the product was extracted from the reaction mixture by using water and ethyl ether. The obtained extract was subjected to fractional distillation to yield a pure primary alcoholic compound with an acetal group.

0.15 mol of the primary alcoholic compound and 0.2 mol of triethylamine were dissolved in purified tetrahydrofuran, then 0.17 mol of acryloyl chloride was slowly added to the solution using a dropping funnel, and the reactants were stirred at ambient temperature for 6 hours. After the reaction ended, amine salt produced during the reaction was removed using a glass filter, and the reaction mass was processed by vacuum distillation to yield a compound of formula 11:

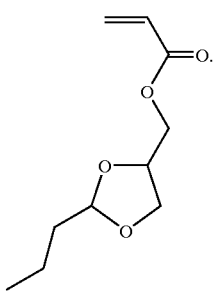

(11)

EXAMPLE 5

A compound of formula 12 was prepared by the same procedure as in Example 4 except that 2-(hydroxymethyl)-1,3-propandiol was used instead of glycerol.

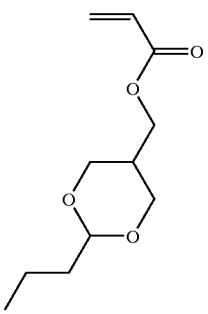

(12)

EXAMPLE 6 t-Butyl cholate was prepared according to the process disclosed in Korean Patent No. 2000-59422. 79.0 g (0.17 mol) of t-butyl cholate and 20 g (0.2 mol) of triethylamine were dissolved in 30 g of purified tetrahydrofuran, and the solution was transferred into a 1000 ml flask.

18.0 g (0.17 mol) of acryloyl chloride was slowly added dropwise to the solution, and the reactants were stirred at ambient temperature for 6 hours. After the reaction ended, amine salt produced during the reaction was removed using a glass filter, and the reaction mass was processed by column chromatography to yield an acryl-based compound having a t-butyl cholate group.

50.0 g (0.094 mol) of the above-obtained compound was dissolved in 200 ml of methylene chloride, and the solution was transferred into a flask, and 150 ml of trifluoroacetic acid was slowly added using a dropping funnel while keeping the solution temperature at 0° C. by means of an ice bath, then the solution was stirred at 0° C. for 2 hours. After the reaction ended, the solution was neutralized with sodium bicarbonate, and then the product was extracted from the reaction mixture by using methylene chloride and water. The extract was processed by column chromatography to yield a compound of formula 13:

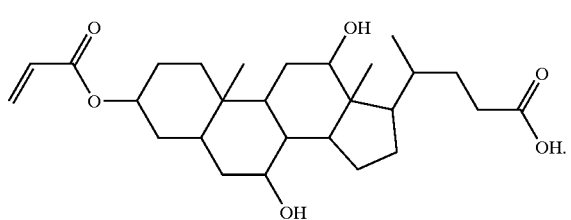

(13)

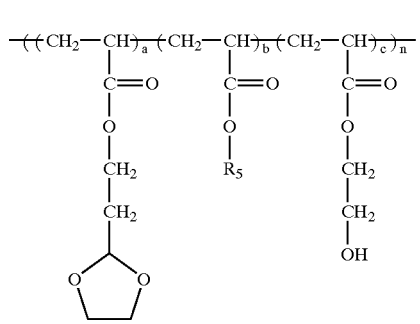

(15)

EXAMPLE 7

The monomer of formula 8 obtained in Example 1 and a monomer of formula 13 obtained in Example 6 were dissolved in tetrahydrofuran. The solution, together with 2,2'-azobisisobutyronitrile as a polymerizing initiator, was introduced into an ampoule for polymerization, and the reactants were processed at 60° C. for 6 hours to be polymerized. After the reaction, the reactants were precipitated in petroleum ether, and the solid mass recovered was dried under reduced pressure to yield a compound of formula 14:

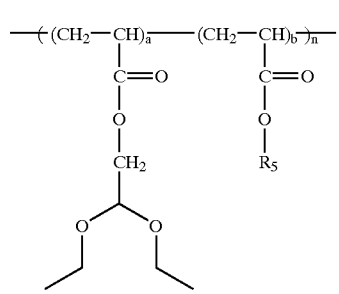

(14)

wherein, a is 0.32, and b is 0.68;

n (the degree of polymerization) is 140; and $R_5$ represents the following structure:

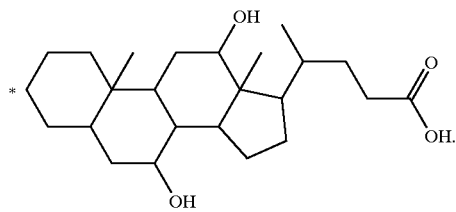

wherein, a is 0.35, b is 0.54, and c is 0.11;

n (the degree of polymerization) is 154; and $R_5$ represents the same structure as defined above.

EXAMPLE 9

The monomer of formula 10 obtained in Example 3, the monomer of formula 13 obtained in Example 6, and 2-hydroxyethylacrylate were dissolved in tetrahydrofuran, and then the same process as in Example 7 was carried out to yield a compound of formula 16:

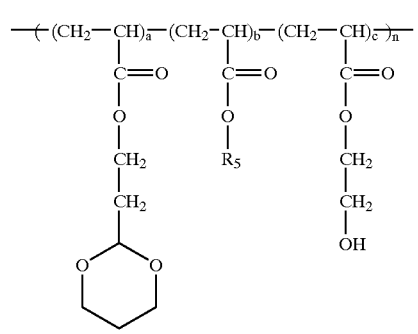

(16)

wherein, a is 0.31, b is 0.56, and c is 0.13;

n (the degree of polymerization) is 171; and $R_5$ represents the same structure as defined above.

EXAMPLE 10

The monomer of formula 11 obtained in Example 4, the monomer of formula 13 obtained in Example 6, 2-hydroxyethylacrylate, and acrylic acid were dissolved in tetrahydrofuran, and then the same process as in Example 7 was carried out to yield a compound of formula 17:

EXAMPLE 8

The monomer of formula 9 obtained in Example 2, the monomer of formula 13 obtained in Example 6, and 2-hydroxyethylacrylate were dissolved in tetrahydrofuran, and then the same process as in Example 7 was carried out to yield a compound of formula 15:

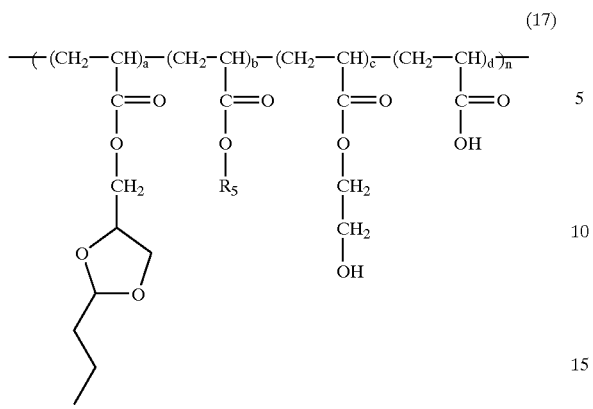

(17)

wherein, a is 0.32, b is 0.51, c is 0.12, and d is 0.05;

n (the degree of polymerization) is 137; and $R_5$ represents the same structure as defined above.

EXAMPLE 11

The monomer of formula 12 obtained in Example 5, the monomer of formula 13 obtained in Example 6, 2-hydroxyethylacrylate, and acrylic acid were dissolved in tetrahydrofuran, and then the same process as in Example 7 was carried out to yield a compound of formula 18:

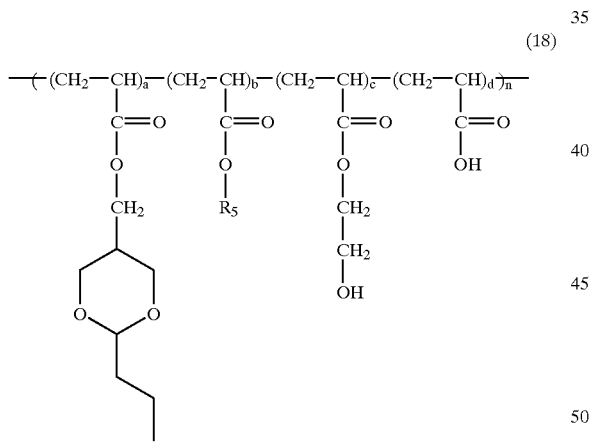

(18)

wherein, a is 0.33, b is 0.48, c is 0.13, and d is 0.06;

n (the degree of polymerization) is 128;

$R_5$ represents the same structure as defined above.

EXAMPLE 12

The monomer of formula 8 obtained in Example 1 was dissolved in tetrahydrofuran, and then the same process as in Example 7 was carried out to yield a homopolymer of formula 19:

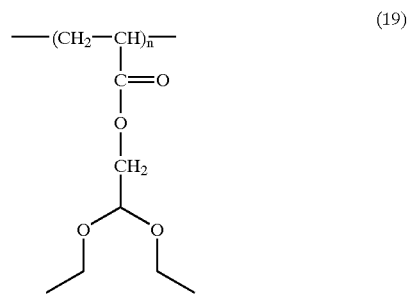

(19)

wherein, n (the degree of polymerization) is 188.

EXAMPLE 13

The monomer of formula 10 obtained in Example 3 was dissolved in tetrahydrofuran, and then the same process as in Example 7 was carried out to yield a homopolymer of formula 20:

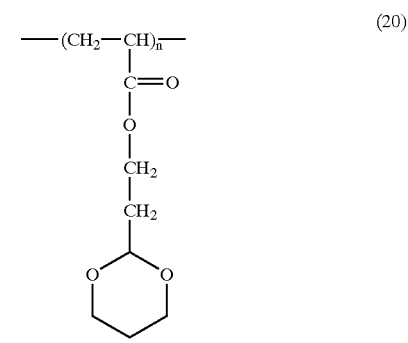

(20)

wherein, n (the degree of polymerizaiton) is of 197.

EXAMPLE 14

The monomer of formula 13 obtained in Example 6 was dissolved in tetrahydrofuran, and then the same process as in Example 7 was carried out to yield a homopolymer of formula 21:

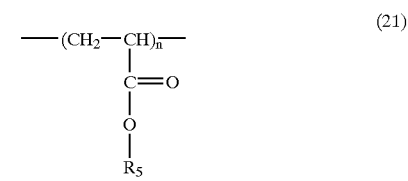

(21)

wherein, n (the degree of polymerization) is 114; and $R_5$ represents the same structure as defined above.

EXAMPLE 15

In a laboratory that is isolated from extreme UV radiation, 0.2 g of the compound of formula 14 prepared in Example 7 and 0.004 g of triphenylsulfonium triplate as a photoacid generator were dissolved in 1.2 g of propylene glycol monomethylether acetate, and then filtered two times with a syringe filter to yield a photoresist composition.

EXAMPLE 16

A photoresist composition was prepared by the same procedure as in Example 15 except that 0.2 g of the compound of formula 15 prepared in Example 8 was used.

EXAMPLE 17

A photoresist composition was prepared by the same procedure as in Example 15 except that 0.2 g of the compound of formula 16 prepared in Example 9 was used.

EXAMPLE 18

A photoresist composition was prepared by the same procedure as in Example 15 except that 0.2 g of the compound of formula 17 prepared in Example 10 was used.

EXAMPLE 19

A photoresist composition was prepared by the same procedure as in Example 15 except that 0.2 g of the compound of formula 18 prepared in Example 11 was used.

EXAMPLE 20

A photoresist composition was prepared by the same procedure as in Example 15 except that 0.06 g of the compound of formula 19 prepared in Example 12 and 0.14 g of the compound of formula 21 prepared in Example 14 were used.

EXAMPLE 21

A photoresist composition was prepared by the same procedure as in Example 15 except that 0.06 g of the compound of formula 20 prepared in Example 13 and 0.14 g of the compound of formula 21 prepared in Example 14 were used.

APPLICATION EXAMPLE 1

After hexamethyldisilazane solution was applied dropwise onto a silicon wafer, the silicon wafer was spin-coated at 1,500 rpm for 30 seconds, then it was pretreated by heating at 110° C. for 90 seconds with a hot-plate. The photoresist composition obtained in Example 15 was applied dropwise onto the pretreated silicon wafer, the silicon wafer was spin-coated at 2,000 rpm for 60 seconds, and then it was pre-baked for 90 seconds on a hot-plate at 100° C. to form a thin film. After the thus-formed thin film was irradiated at 17 mJ/cm$^2$ of exposure with a UV irradiator, it was post-baked for 120 seconds on a hot-plate at 120° C. The post-baked wafer was dipped in a 2.38% by weight aqueous solution of tetramethylammonium hydroxide used as a developer for 120 seconds, whereby a negative image with a 0.5 µm resolution (pattern of 0.5 µm width) was obtained.

APPLICATION EXAMPLE 2

After pretreatment of a silicon wafer in the same manner as in Application Example 1, the photoresist composition obtained in Example 16 was applied dropwise onto the pretreated silicon wafer, the silicon wafer was spin-coated at 2,000 rpm for 60 seconds, and then it was pre-baked for 90 seconds on a hot-plate at 100° C. to form a thin film. After the thus-formed thin film was irradiated at 23 mJ/cm$^2$ of exposure with a UV irradiator, it was post-baked for 120 seconds on a hot-plate at 120° C. The post-baked wafer was dipped in a 2.38% by weight aqueous solution of tetramethylammonium hydroxide used as a developer for 90 seconds, whereby a negative image with a 0.5 µm resolution was obtained.

APPLICATION EXAMPLE 3

After pretreatment of a silicon wafer in the same manner as in Application Example 1, the photoresist composition obtained in Example 17 was applied dropwise onto the pretreated silicon wafer, the silicon wafer was spin-coated at 2,000 rpm for 60 seconds, and then it was pre-baked for 90 seconds on a hot-plate at 100° C. to form a thin film. After the thus-formed thin film was irradiated at 25 mJ/cm$^2$ of exposure with a UV irradiator, it was post-baked for 120 seconds on a hot-plate at 120° C. The post-baked wafer was dipped in a 2.38% by weight aqueous solution of tetramethylammonium hydroxide used as a developer for 90 seconds, whereby a negative image with a 0.5 µm resolution was obtained.

APPLICATION EXAMPLE 4

After pretreatment of a silicon wafer in the same manner as in Application Example 1, the photoresist composition obtained in Example 18 was applied dropwise onto the pretreated silicon wafer, the silicon wafer was spin-coated at 2,000 rpm for 60 seconds, and then it was pre-baked for 90 seconds on a hot-plate at 100° C. to form a thin film. After the thus-formed thin film was irradiated at 30 mJ/cm$^2$ of exposure with a UV irradiator, it was post-baked for 120 seconds on a hot-plate at 130° C. The post-baked wafer was dipped in a 2.38% by weight aqueous solution of tetramethylammonium hydroxide used as a developer for 90 seconds, whereby a negative image with a 0.5 µm resolution was obtained.

APPLICATION EXAMPLE 5

After pretreatment of a silicon wafer in the same manner as in Application Example 1, the photoresist composition obtained in Example 19 was applied dropwise onto the pretreated silicon wafer, the silicon wafer was spin-coated at 2,000 rpm for 60 seconds, and then it was pre-baked for 90 seconds on a hot-plate at 100° C. to form a thin film. After the thus-formed thin film was irradiated at 30 mJ/cm$^2$ of exposure with a UV irradiator, it was post-baked for 120 seconds on a hot-plate at 130° C. The post-baked wafer was dipped in a 2.38% by weight aqueous solution of tetramethylammonium hydroxide used as a developer for 90 seconds, whereby a negative image with a 0.5 µm resolution was obtained.

APPLICATION EXAMPLE 6

After pretreatment of a silicon wafer in the same manner as in Application Example 1, the photoresist composition obtained in Example 20 was applied dropwise onto the pretreated silicon wafer, the silicon wafer was spin-coated at 2,000 rpm for 60 seconds, and then it was pre-baked for 90 seconds on a hot-plate at 100° C. to form a thin film. After the thus-formed thin film was irradiated at 20 mJ/cm$^2$ of exposure with a UV irradiator, it was post-baked for 120 seconds on a hot-plate at 130° C. The post-baked wafer was dipped in a 2.38% by weight aqueous solution of tetramethylammonium hydroxide used as a developer for 90 seconds, whereby a negative image with a 0.5 µm resolution was obtained.

APPLICATION EXAMPLE 7

After pretreatment of a silicon wafer in the same manner as in Application Example 1, the photoresist composition obtained in Example 21 was applied dropwise onto the pretreated silicon wafer, the silicon wafer was spin-coated at 2,000 rpm for 60 seconds, and then it was pre-baked for 90 seconds on a hot-plate at 100° C. to form a thin film. After the thus-formed thin film was irradiated at 27 mJ/cm$^2$ of exposure with a UV irradiator, it was post-baked for 120 seconds on a hot-plate at 130° C. The post-baked wafer was dipped in a 2.38% by weight aqueous solution of tetramethylammonium hydroxide used as a developer for 90 seconds, whereby a negative image with a 0.5 μm resolution was obtained.

When a photoresist composition is made using the polymer according to the present invention, a high degree of cross linking of the photoresist composition brings about a big difference in solubility toward a developing agent between the exposed portion and the unexposed portion, and thus negative patterns of high sensitivity can be obtained. In addition, since no swelling of the photoresist appears during the developing process, unlike conventional negative photoresists, high resolution patterns with superior shapes can be obtained.

What is claimed is:

1. A polymer for a chemically amplified negative photoresist, comprising up to four units and represented by formula:

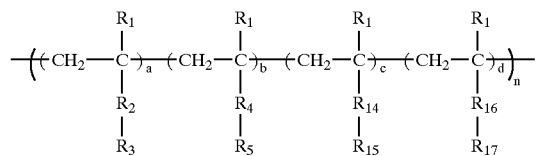

wherein each of the up to four monomer units present is different from the other monomer units present;

$R_1$ is H or $CH_3$;

$R_2$ and $R_4$ are each independently selected from $(R)_\alpha(CH_2)_\beta R'$ and $(R)_\alpha[(CH_2)_\gamma O]_\delta R'$, wherein, R is CO, $CO_2$, O, OCO, or $OCO_2$, R' is O, $CO_2$, or $OCO_2$, $\alpha$ is 0 or 1, $\beta$ is 0 to 5, $\gamma$ is 1 or 2, and $\delta$ is 1 to 5;

$R_3$ is represented by one of the formulae:

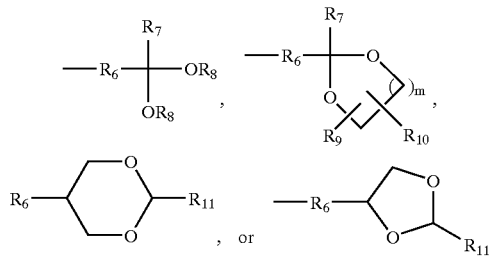

wherein $R_6$, which combines an acetal compound and a vinyl compound, is a $C_1$–$C_5$ saturated alkyl, a $C_1$–$C_5$ ether, or a $C_1$–$C_5$ carbonyl; $R_7$ to $R_{11}$ are each independently selected from H, $C_1$–$C_5$ saturated alkyls, $C_1$–$C_5$ ethers, $C_1$–$C_5$ carbonyl groups, $C_1$–$C_5$ alcohol groups; and m is a number ranging from 1–5; and $R_5$ is represented by formula:

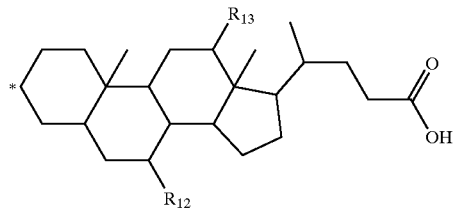

wherein $R_{12}$ and $R_{13}$ are each independently selected from H and OH, and * represents the bonding site at which the $R_4$ group is bonded;

$R_{14}$ and $R_{16}$ are each independently selected from a single bond, $(R)_\alpha(CH_2)_\beta R'$ and $(R)_\alpha[(CH_2)_\gamma O]_\delta R'$, wherein R is CO, $CO_2$, O, OCO, or $OCO_2$, R' is O, $CO_2$, or $OCO_2$, $\alpha$ is 0 or 1, $\beta$ is 0 to 5, $\gamma$ is 1 or 2, and $\delta$ is 1 to 5;

$R_{15}$ is a hydroxyl group;

$R_{17}$ is a carboxyl group;

a, b, c, and d represent mole ratios of each monomer, a has a value of 0–0.5, b has a value of 0–0.9, c has a value of 0–0.3, and d has a value of 0–0.3, provided that a+b+c+d=1; and n represents the degree of polymerization of each polymer, and has a value of at least 2.

2. The polymer for a chemically amplified negative photoresist according to claim 1 wherein:

$R_1$ is H;

$R_2$ is $CO_2$;

$R_3$ is

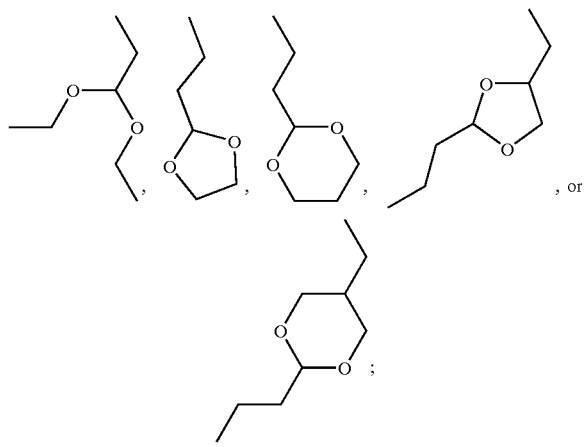

$R_4$ is $CO_2$;

$R_5$ is

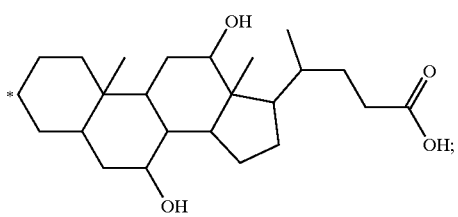

$R_{14}$ is $CO_2CH_2CH_2$, $R_{15}$ is OH, $R_{16}$ is a single bond, and
$R_{17}$ is COOH.

3. A chemically amplified negative photoresist composition comprising;
   a photoacid generator; and
   a polymer comprising up to four monomer units of formula:

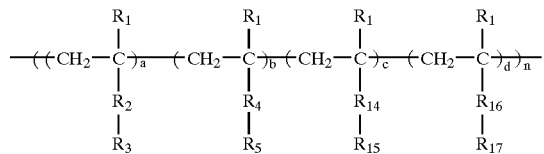

wherein each of the up to four monomer units present is different from the other monomer units present;
$R_1$ is H or $CH_3$;
$R_2$ and $R_4$ are each independently selected from $(R)_\alpha(CH_2)_\beta R'$ and $(R)_\alpha[(CH_2)_\gamma O]_\delta R'$, wherein, R is CO, $CO_2$, O, OCO, or $OCO_2$, R' is O, $CO_2$, or $OCO_2$, $\alpha$ is 0 or 1, $\beta$ is 0 to 5, $\gamma$ is 1 or 2, and $\delta$ is 1 to 5;
$R_3$ is represented by one of the formulae:

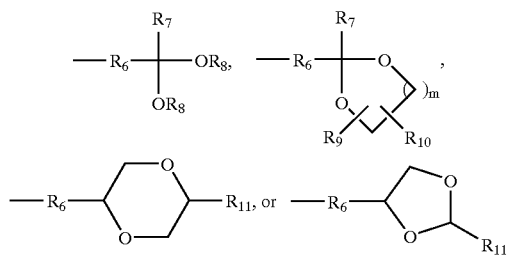

wherein $R_6$, which combines an acetal compound and a vinyl compound, is a $C_1$–$C_5$ saturated alkyl, a $C_1$–$C_5$ ether, or a $C_1$–$C_5$ carbonyl; $R_7$ to $R_{11}$ are each independently selected from H, $C_1$–$C_5$ saturated alkyls, $C_1$–$C_5$ ethers, $C_1$–$C_5$ carbonyl groups, and $C_1$–$C_5$ alcohol groups; and m is a number ranging from 1–5; and
$R_5$ is represented by the formula:

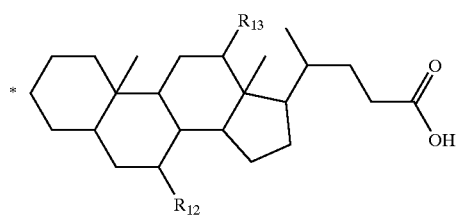

wherein $R_{12}$ and $R_{13}$ are each independently H or OH; and * represents the bonding site at which the $R_4$ group is bonded;
$R_{14}$ and $R_{16}$ are each independently selected from a single bond, $(R)_\alpha(CH_2)_\beta R'$ and $(R)_\alpha[(CH_2)_\gamma O]_\delta R'$, wherein R is CO, $CO_2$, O, OCO, or $OCO_2$, R' is O, $CO_2$, or $OCO_2$, $\alpha$ is 0 or 1, $\beta$ is 0 to 5, $\gamma$ is 1 or 2, and $\delta$ is 1 to 5;
$R_{15}$ is a hydroxyl group;
$R_{17}$ is a carboxyl group;
a, b, c, and d represent the mole ratios of each monomer, wherein a has a value of 0–0.5, b has a value of 0–0.9, c has a value of 0–0.3, and d has a value of 0–0.3, provided that a+b+c+d=1; and
n represents the degree of polymerization of each polymer, and has a value of at least 2.

4. The chemically amplified negative photoresist composition according to claim 3 wherein
$R_1$ is H;
$R_2$ is $CO_2$;
$R_3$ is

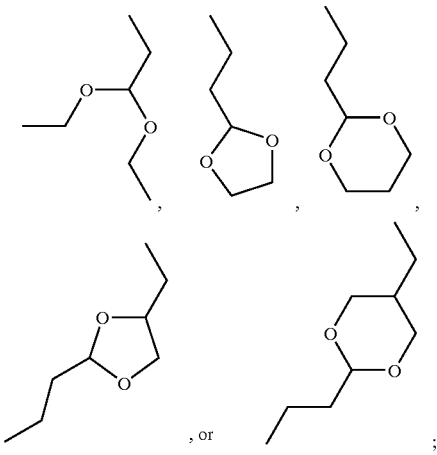

$R_4$ $CO_2$;
$R_5$ is

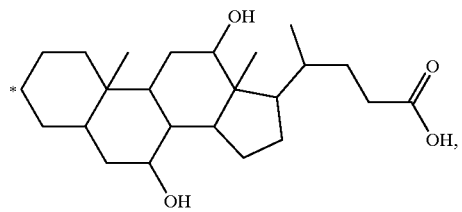

$R_{14}$ is $CO_2CH_2CH_2$,
$R_{15}$ is OH,
$R_{16}$ is a single bond, and
$R_{17}$ is COOH.

5. The chemically amplified negative photoresist composition according to claim 3 wherein the photoresist composition comprises 10 to 20 wt. % of said polymer and 0.1 to 1.0 wt. % of said photoacid generator.

* * * * *